US012813223B2

(12) United States Patent
Aida et al.

(10) Patent No.: US 12,813,223 B2
(45) Date of Patent: Nov. 24, 2026

(54) WAFER SUPPORT DEVICE AND FILM FORMING APPARATUS

(71) Applicant: ASM IP Holding B.V., Almere (NL)

(72) Inventors: Koei Aida, Hachioji (JP); Yukihiro Mori, Machida (JP)

(73) Assignee: ASM IP Holding B.V., Almere (NL)

( * ) Notice: Subject to any disclaimer, the term of this patent is extended or adjusted under 35 U.S.C. 154(b) by 386 days.

(21) Appl. No.: 18/141,671

(22) Filed: May 1, 2023

(65) Prior Publication Data

US 2023/0360953 A1 Nov. 9, 2023

Related U.S. Application Data

(60) Provisional application No. 63/338,418, filed on May 4, 2022.

(51) Int. Cl.
*H10P 72/76* (2026.01)
*C23C 16/458* (2006.01)

(52) U.S. Cl.
CPC ...... *H10P 72/7612* (2026.01); *C23C 16/4586* (2013.01); *H10P 72/7614* (2026.01)

(58) Field of Classification Search
CPC ........... H01L 21/68742; H01L 21/6875; C23C 16/4586
USPC ........................................................ 118/728
See application file for complete search history.

(56) References Cited

U.S. PATENT DOCUMENTS 5,946,183 A 8/1999 Yamada et al.
6,628,503 B2 9/2003 Sogard
7,307,696 B2 12/2007 Ottens et al.
8,840,727 B2 9/2014 Kato et al.
9,741,546 B2 8/2017 Carducci et al.
9,991,153 B2 * 6/2018 Hou .................. H01L 21/67115
10,854,498 B2 12/2020 Shoji
2002/0036373 A1 * 3/2002 Kosakai ................ B25B 11/005 269/21
2002/0174950 A1 11/2002 Park
2007/0160507 A1 * 7/2007 Satoh .................. C23C 16/4586 422/135
2010/0184290 A1 7/2010 Kim et al.
2012/0320491 A1 * 12/2012 Doh .................... H01L 21/6833 361/234
2014/0265090 A1 9/2014 Hou
2015/0000599 A1 * 1/2015 Chen ................. H01L 21/68742 118/728
2017/0263487 A1 * 9/2017 Boyd, Jr. .......... H01J 37/32706
2018/0102247 A1 4/2018 Kato

FOREIGN PATENT DOCUMENTS

JP H11-297789 A 10/1999
JP H11330219 A 11/1999
JP 2002009064 A 1/2002
(Continued)

*Primary Examiner* — Parviz Hassanzadeh
(74) *Attorney, Agent, or Firm* — Snell & Wilmer L.L.P.

(57) ABSTRACT

A wafer support device includes a susceptor having a wafer mounting surface provided on one surface and a lift pin through hole arranged in the wafer mounting surface, a lift pin inserted into the lift pin through hole, and an elevating device that raises and lowers the susceptor, the wafer mounting surface of the susceptor is uneven, a ventilation path is formed between the lift pin through hole and the lift pin.

11 Claims, 7 Drawing Sheets

(56) References Cited

FOREIGN PATENT DOCUMENTS

| | | | |
|---|---|---|---|
| JP | 2004006925 | A | 1/2004 |
| JP | 2006156938 | A | 6/2006 |
| JP | 2006245621 | A | 9/2006 |
| JP | 2006257495 | A | 9/2006 |
| JP | 2017183700 | A | 10/2017 |
| KR | 20070080159 | A | 8/2007 |
| KR | 20100013032 | U | 12/2010 |
| KR | 101125739 | B1 | 3/2012 |
| KR | 20190064188 | A | 6/2019 |

* cited by examiner

WAFER SUPPORT DEVICE AND FILM FORMING APPARATUS

CROSS-REFERENCE TO RELATED APPLICATIONS

This application claims priority to U.S. Provisional Patent Application Ser. No. 63/338,418 filed May 4, 2022 titled WAFER SUPPORT DEVICE AND FILM FORMING APPARATUS, the disclosure of which is hereby incorporated by reference in its entirety.

TECHNICAL FIELD

The present disclosure relates to a wafer support device and a film forming apparatus.

BACKGROUND ART

The CVD apparatus is known as a thin film forming apparatus that forms a thin film by depositing a substance generated by a chemical reaction of a source gas containing a thin film component on the surface of a substrate to be processed (for example, a silicon wafer). As the CVD apparatus, a plasma CVD apparatus is widely used. In a plasma CVD apparatus, a chemical reaction is promoted by exciting a source gas into a plasma state and generating active excited molecules, radicals, and ions. In the plasma CVD apparatus, a wafer support device that supports a wafer to be film-deposited is arranged in the chamber. Above the wafer support device, a shower head for introducing the source gas to the inside of the chamber is arranged. Plasma is generated by applying a radio frequency (RF) voltage between the shower head and the wafer support device.

As a wafer support device, a device having a susceptor, an elevating device, and a lift pin is known (see, US2012/0149194). The susceptor has a wafer mounting surface on which the wafer is mounted. A through hole for a lift pin is provided on the wafer mounting surface of the susceptor, and the lift pin is inserted into the through hole for the lift pin. When a thin film is formed on the wafer surface arranged on the wafer mounting surface, the susceptor is raised by an elevating device so that the lift pin does not protrude from the wafer mounting surface. After forming a thin film on the wafer surface, the susceptor is lowered by the elevating device to project the lift pin from the wafer mounting surface, so that the wafer after the film forming process is transferred from the wafer mounting surface to the head of the lift pin to make it easier to take out the wafer after the film formation process. Further, in order to reduce the number of particles adhering to the back surface of the wafer during the film forming process, unevenness is formed on the wafer mounting surface of the susceptor to reduce the contact area between the susceptor and the wafer. (see, U.S. Ser. No. 10/854,498B2).

It is effective to provide unevenness on the wafer mounting surface of the susceptor in order to reduce the contact area between the susceptor and the wafer. However, if the wafer mounting surface is provided with unevenness, gas may remain between the wafer and the wafer mounting surface when the pressure inside the chamber of the plasma CVD apparatus is reduced. If gas remains between the wafer and the wafer mounting surface, it causes the wafer arranged on the wafer mounting surface of the susceptor to move (slip). For example, if the wafer moves when the susceptor is moved up and down and the wafer placement location shifts, there is a possibility that adverse effects such as difficulty in forming a film at a planned position may occur. Further, if the wafer moves during the film forming process, it may be difficult to uniformly form a thin film on the wafer. Further, if the movement of the wafer due to slip becomes too large and the wafer protrudes from the susceptor, it may be difficult for a wafer transfer robot to take out the wafer to the outside.

SUMMARY OF THE INVENTION

A first aspect of the present disclosure provides a wafer support device including a susceptor having a wafer mounting surface provided on one surface and a lift pin through hole arranged in the wafer mounting surface, a lift pin inserted into the lift pin through hole, and an elevating device that raises and lowers the susceptor, the wafer mounting surface of the susceptor is uneven, a ventilation path is formed between the lift pin through hole and the lift pin.

In the wafer support device according to the aspect, the lift pin may have a shaft and a head having a diameter larger than that of the shaft, the lift pin through hole has a head insertion portion having a diameter larger than that of the head of the lift pin formed on the wafer mounting surface side, and a shaft insertion portion which is connected to the head insertion portion via a step portion, has a smaller diameter than the head insertion portion and a larger diameter than the shaft of the lift pin, when the susceptor is moved to a lower limit position by the elevating device, the head and the step portion are separated, and when the susceptor is moved to an upper limit position by the elevating device, the head and the step portion are engaged so as to form a gap at least in a part thereof.

In the wafer support device according to the aspect, the head of the lift pin may have a notch in a part of the surface of the lift pin through hole on the step portion side.

In the wafer support device according to the aspect, the lift pin through hole may have a defective portion in a part of the step portion.

In the wafer support device according to the aspect, the wafer mounting surface may have a plurality of protrusions.

A second aspect of the present disclosure provides a film forming apparatus including a chamber and a wafer support device according to the above aspect, which is located inside the chamber.

A third aspect of the present disclosure provides a wafer support device including a susceptor having a wafer mounting surface provided on one surface and a lift pin through hole arranged in the wafer mounting surface, a lift pin inserted into the lift pin through hole and an elevating device that raises and lowers the susceptor, the wafer mounting surface of the susceptor is uneven, a ventilation hole penetrating the susceptor is provided in the wafer mounting surface.

A fourth aspect of the present disclosure provides a film forming apparatus including a chamber and a wafer support device according to the third aspect, which is located inside the chamber.

DETAILED DESCRIPTION OF THE INVENTION

Hereinafter, the present disclosure will be described in detail with reference to the drawings as appropriate. The drawings used in the following description may be enlarged for convenience in order to make the features of the present disclosure easy to understand, and the dimensional ratio of each component may differ from the actual one. The materials, dimensions, etc. exemplified in the following description are examples, and the present disclosure is not limited thereto and it is possible to appropriately change and implement the present disclosure within a range in which the effects of the present disclosure can be obtained.

Figure 1:
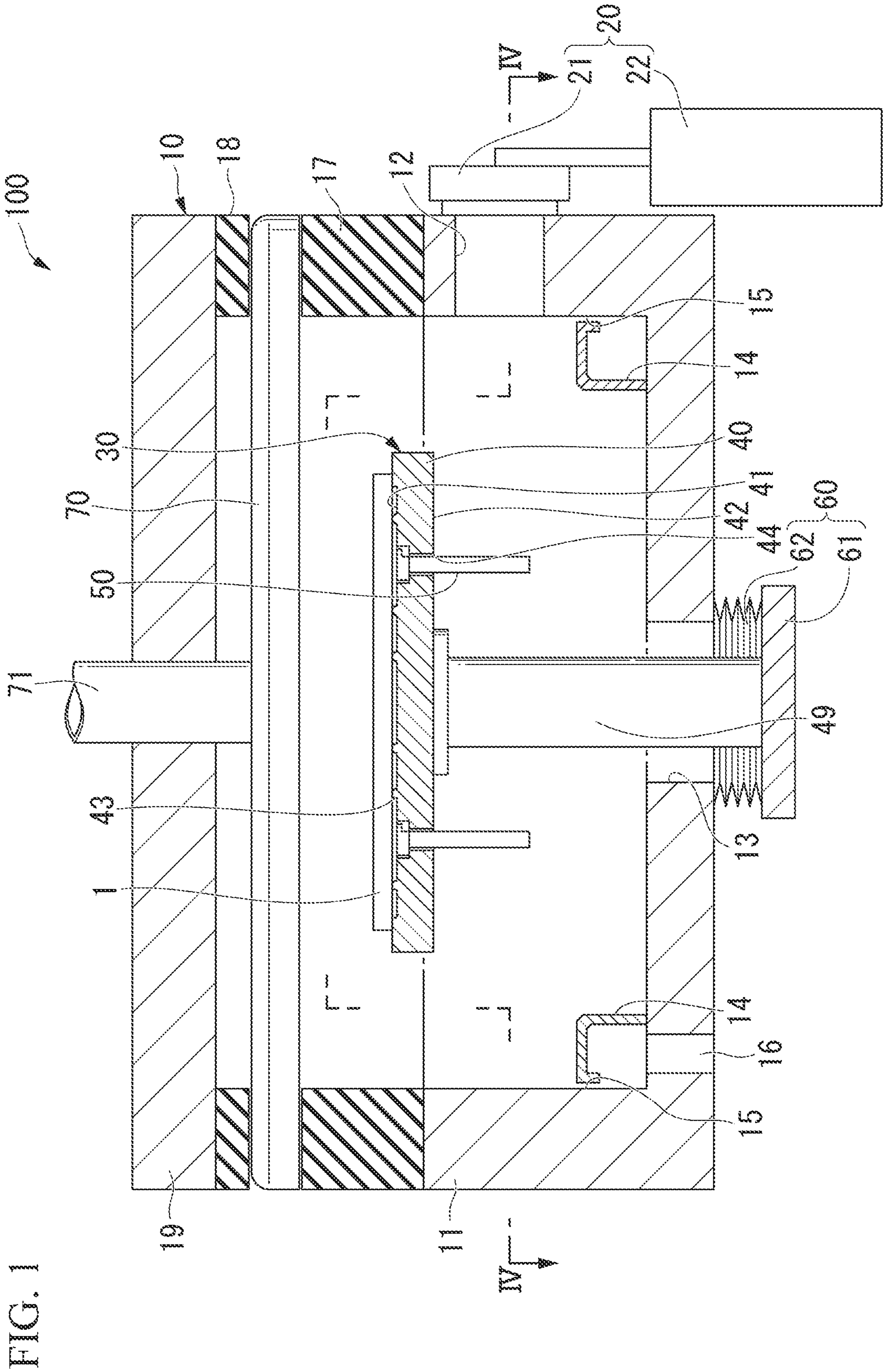
FIG. 1 is a cross-sectional view showing an example of a chamber of a plasma CVD apparatus according to an embodiment of the present disclosure.
Figure 2:
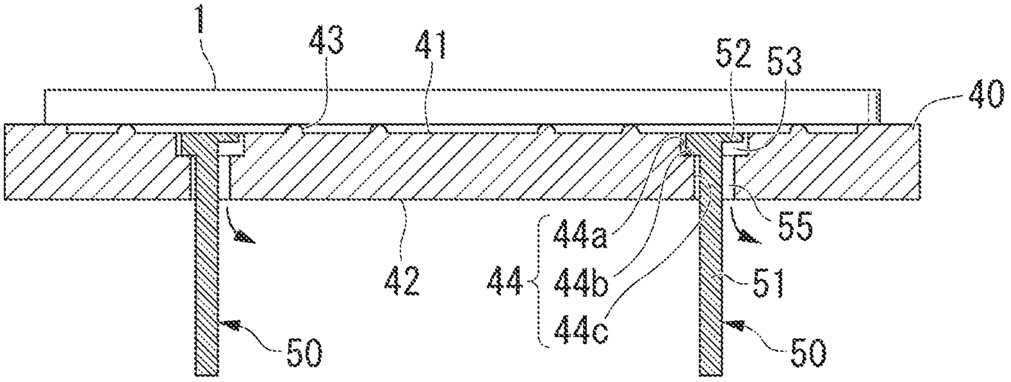
FIG. 2 is an enlarged cross-sectional view of the susceptor of FIG. 1.
Figure 3:
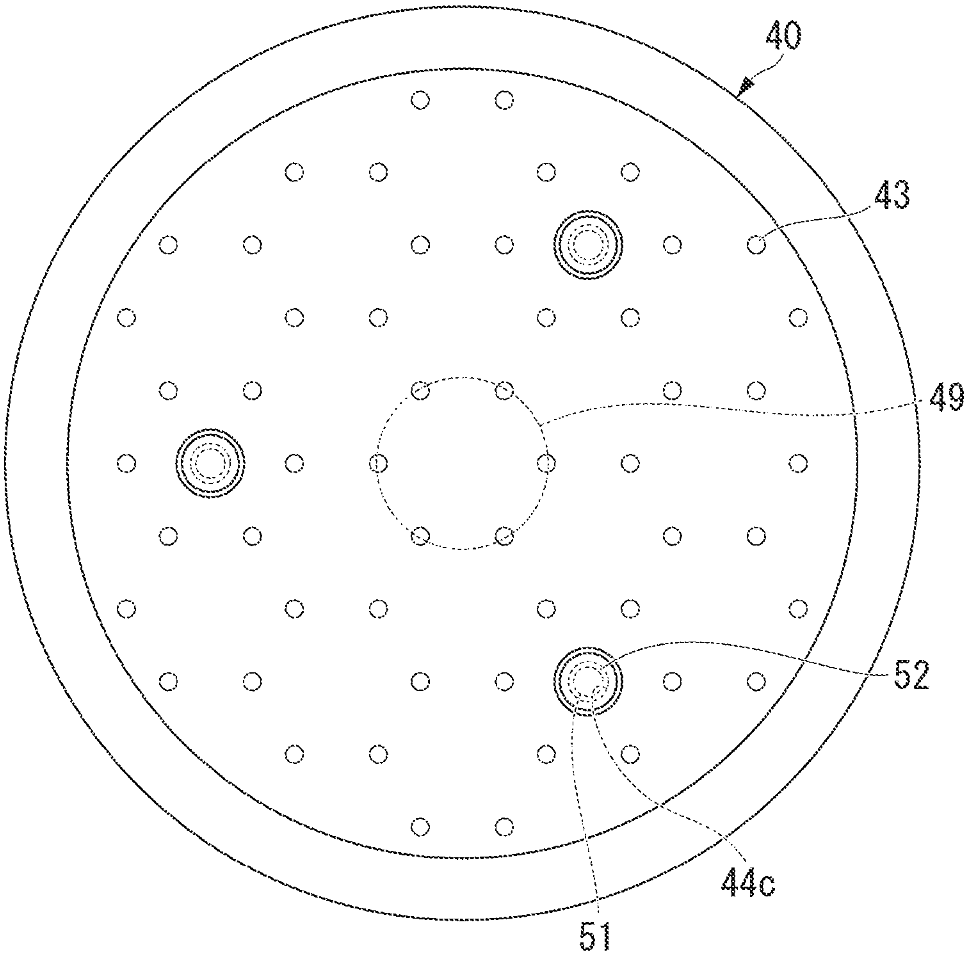
FIG. 3 is a plan view of the susceptor of FIG. 1.
Figure 4:
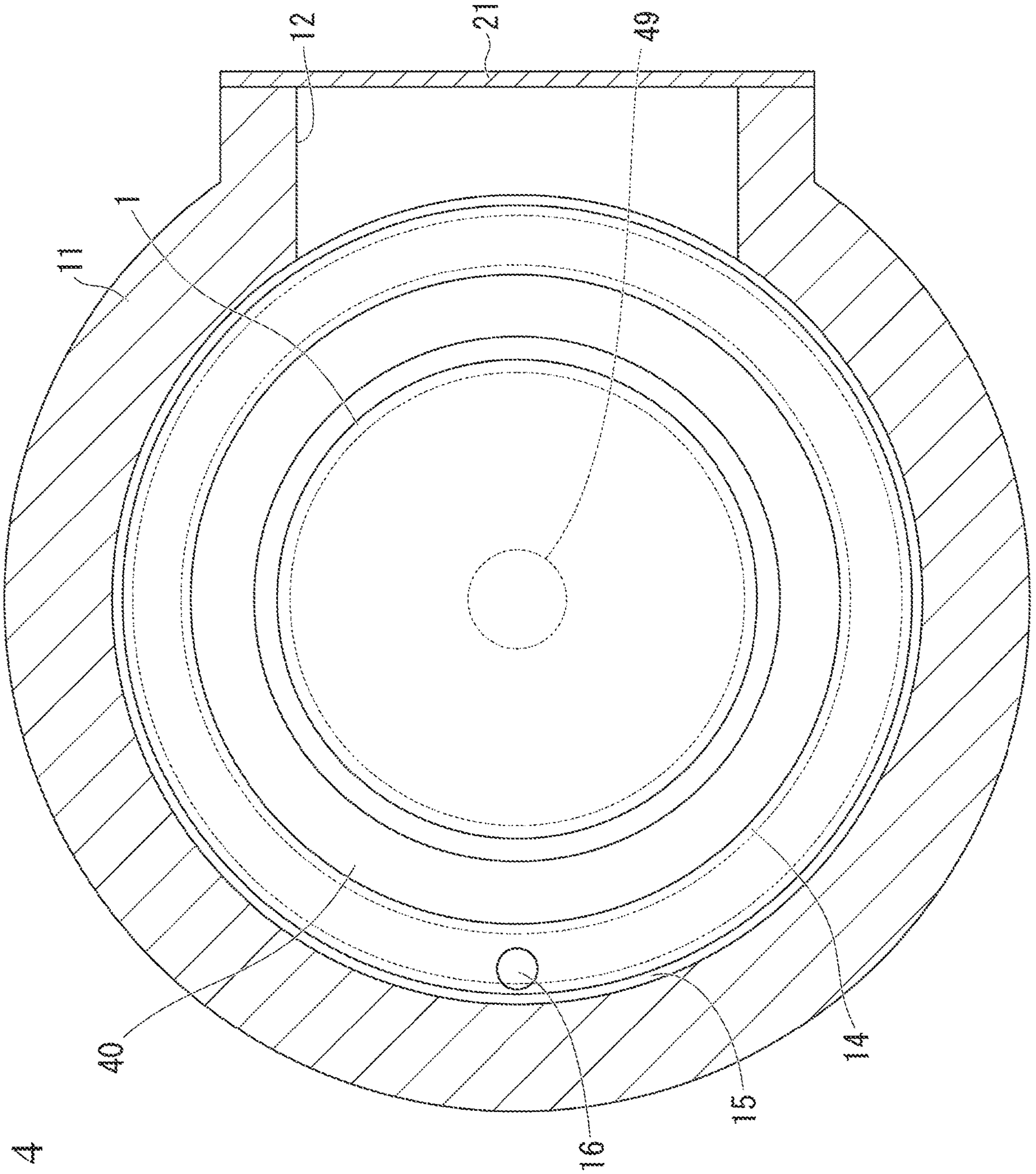
FIG. 4 is a cross-sectional view taken along line VI-VI of FIG. 1.
Figure 5:
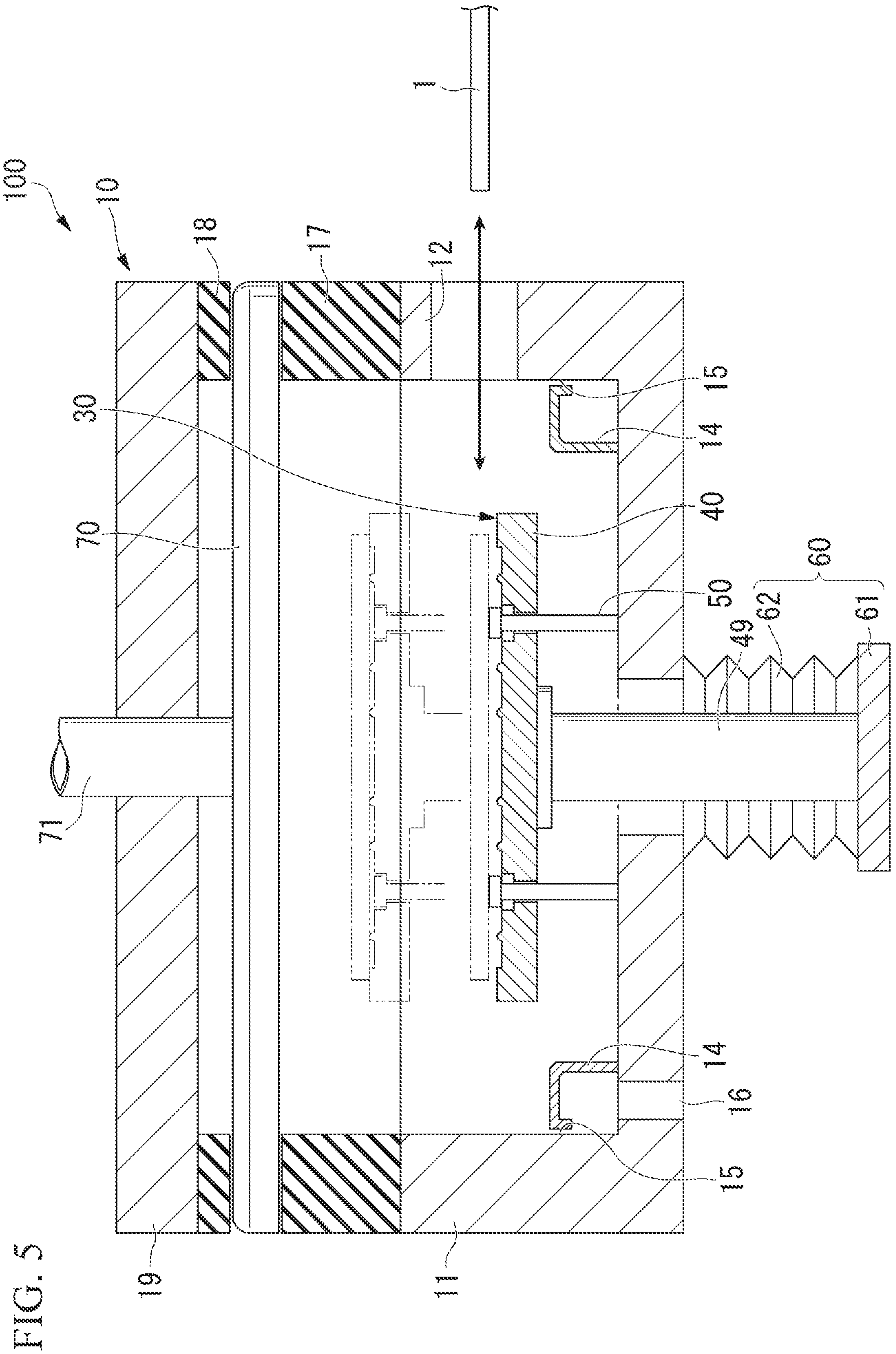
FIG. 5 is a cross-sectional view showing a form when a wafer is carried in or out of the chamber shown in FIG. 1.

FIG. 1 is a cross-sectional view showing an example of a plasma CVD apparatus according to an embodiment of the present disclosure. FIG. 2 is an enlarged cross-sectional view of the susceptor of FIG. 1, FIG. 3 is a plan view of the susceptor of FIG. 1, and FIG. 4 is a cross-sectional view taken along line VI-VI of FIG. 1. Further, FIG. 5 is a cross-sectional view showing the loading or unloading of a wafer into the chamber shown in FIG. 1.

As shown in FIGS. 1 to 5, the plasma CVD apparatus 100 of the present embodiment includes a chamber 10, a gate valve 20 that opens and closes a wafer entry/takeout port of the chamber 10, a wafer support device 30 that supports the wafer 1, a shower head 70 for introducing a source gas inside the chamber 10.

The chamber 10 is a substantially cylindrical body. The chamber 10 has a chamber body 11 and a lid member 19. The chamber body 11 and the lid member 19 may be made of a metal material. As the metal material, for example, aluminum can be used.

The wafer entry/takeout port 12 is provided on the side of the chamber body 11. A first insulating member 17 and a second insulating member 18 are arranged on the wafer entry/takeout port 12. As the material of the first insulating member 17 and the second insulating member 18, a ceramic material such as $Al_2O_3$ can be used. A shower head 70 is arranged between the first insulating member 17 and the second insulating member 18, whereby the shower head 70 is supported by the chamber 10.

A through hole 13 for raising and lowering the susceptor is provided at the bottom of the chamber main body 11. Further, on the bottom of the chamber body 11, an exhaust gas partition wall 14 is provided along the side portion of the chamber main body 11. The exhaust gas that has flowed from the opening 15 of the exhaust gas partition wall 14 to the inside of the exhaust gas partition wall 14 is discharged to the outside through the exhaust gas port 16.

The gate valve 20 has a door portion 21 and a drive portion 22. The wafer entry/takeout port 12 can be opened/closed with respect to the outside by moving the door portion 21 by the drive portion 22.

The wafer support device 30 includes a susceptor 40, a lift pin 50, and a lifting device 60. The susceptor 40 has a wafer mounting surface 41 provided on the surface facing the shower head 70 and a lift pin through hole 44 arranged in the wafer mounting surface 41. The lift pin through hole 44 penetrates from the wafer mounting surface 41 to the back surface 42 facing the wafer mounting surface 41. Three lift pin through holes 44 are formed concentrically at equal intervals.

The wafer mounting surface 41 is provided with protrusions 43 on the surface thereof. The protrusions 43 form unevenness on the wafer mounting surface 41. As a result, the contact area between the susceptor 40 and the wafer 1 is reduced. The wafer mounting surface 41 has, for example, a circular shape having a diameter of 100 mm or more and 500 mm or less. The protrusion 43 may have a dome shape having a diameter of 1 mm or more and 5 mm or less and a height of 1 μm or more and 100 μm or less. The number of protrusions 43 on the wafer mounting surface 41 is, for example, in the range of 10 or more and 100 or less. In the present embodiment, the protrusions 43 form unevenness on the wafer mounting surface 41, but the wafer mounting surface 41 may be blasted to form unevenness on the wafer mounting surface 41.

The susceptor 40 may be provided with a heating element inside so as to function as a heater at the time of film formation. The susceptor 40 may be formed of a highly thermally conductive material. Aluminum nitride can be mentioned as an example of a highly thermally conductive material.

The susceptor 40 is supported by a support member 49. The end of the support member 49 on the opposite side of the susceptor 40 protrudes to the outside of the chamber body 11 through the susceptor elevating through hole 13. Similar to the susceptor 40, a highly thermally conductive material may be formed.

The lift pin 50 is inserted into the lift pin through hole 44. In this embodiment, the lift pin 50 has a shaft 51 and a head 52 having a diameter larger than that of the shaft 51. The lift pin through hole 44 of the susceptor 40 has a head insertion portion 44*a* formed on the wafer mounting surface 41 side, and a shaft insertion portion 44*c* connected to the head insertion portion 44*a* via a step portion 44*b*. The head insertion portion 44*a* has a larger diameter than the head 52 of the lift pin 50. The shaft insertion portion 44*c* has a smaller diameter than the head insertion portion 44*a* and a larger diameter than the shaft 51 of the lift pin 50. The head 52 of the lift pin 50 has a notch 53 on a part of the surface of the through hole 44 for the lift pin on the step portion 44*b* side.

As a result, when the head 52 of the lift pin 50 is housed in the head insertion portion 44*a*, a ventilation passage 55 is formed by a gap between the head 52 of the lift pin 50 and the head insertion portion 44*a*, a notch 53 of the head 52, and a gap between the shaft 51 of the lift pin 50 and the shaft insertion portion 44*c* (see FIG. 2).

The lift pin may be made of a metallic material. As the metal material, for example, aluminum can be used.

The elevating device 60 has a moving plate 61 fixed to an end portion of the support member 49 opposite to the susceptor 40 side, and a stretchable portion 62 that can be expanded and contracted in the vertical direction. By extending the stretchable portion 62 and lowering the moving plate 61, the susceptor is also lowered together with the support member 49. On the other hand, by contracting the stretchable portion 62 and raising the moving plate 61, the susceptor also rises together with the support member 49.

The shower head 70 is connected to a source gas pipe 71. The shower head 70 has a large number of ventilation holes (not shown). The shower head 70 discharges the source gas supplied from the source gas pipe 71 toward the wafer 1 arranged on the wafer mounting surface of the susceptor 40 through the ventilation holes thereof.

Next, a film forming method using the plasma CVD apparatus 100 of the present embodiment will be described.

The film forming method using the plasma CVD apparatus 100 may include, for example, the following steps.

Carry-in step of mounting the wafer 1 on the upper surface of the wafer mounting surface 41 of the susceptor 40.

A film forming step for forming a film on the wafer 1 by the CVD method.

Carry-out step to take out the wafer 1 after film forming to the outside.

In the carry-in step, first, the lifting device 60 is used to lower the susceptor 40 as shown in FIG. 5. When the susceptor 40 is lowered, the end portion 51*a* of the shaft 51 on the side opposite to the head 52 of the lift pin 50 comes into contact with the bottom surface 11*a* of the chamber main body 11. As a result, the lift pin 50 is fixed. When the susceptor 40 is lowered with the lift pin 50 fixed, the head 52 of the lift pin 50 and the step portion 44*b* of the through hole 44 for the lift pin are separated, and the wafer 1 is separated from the wafer mounting surface 41. In the present embodiment, the position of the susceptor 40 at which the head 52 of the lift pin 50 and the step portion 44*b* of the through hole 44 for the lift pin are separated is referred to as a lower limit position. With the susceptor 40 lowered to the lower limit position, the drive unit 22 of the gate valve 20 is driven to move the door unit 21 to open the wafer entry/takeout port 12 to the outside. Then, the wafer 1 is arranged on the head 52 of the lift pin 50. Next, the drive unit 22 of the gate valve 20 is driven to move the door unit 21 to close the wafer entry/takeout port 12. Then, the susceptor 40 is raised by using the elevating device 60. When the susceptor 40 is raised, the head 52 of the lift pin 50 is housed in the head insertion portion 44*a*, and a part of the head 52 of the lift pin 50 comes into contact with the step portion 44*b* of the through hole 44 for the lift pin. When the susceptor 40 is raised while the head 52 of the lift pin 50 and the stepped portion 44*b* of the through hole 44 for the lift pin are in contact with each other, the end portion 51*a* of the shaft 51 of the lift pin 50 is separated from the bottom surface 11*a* of the chamber body 11, and a ventilation passage 55 is formed between the lift pin 50 and the lift pin through hole 44. Further, the susceptor 40 is raised to arrange the wafer 1 at the film forming position. In the present embodiment, the position of the susceptor 40 when the wafer 1 is film-formed is referred to as the upper limit position. The chamber 10 is depressurized with the susceptor 40 raised to the upper limit position. The gas between the wafer 1 and the wafer mounting surface 41 is exhausted to the inside of the chamber 10 through the ventilation passage 55. As a result, the pressure between the wafer 1 and the wafer mounting surface 41 becomes the same as the internal pressure of the chamber 10.

In the film forming process, the source gas is discharged toward the wafer 1 from the ventilation holes of the shower head 70, and a high frequency (RF) voltage is applied between the shower head 70 and the wafer mounting surface 41 of the susceptor 40 to bring a source gas in a plasma state. As a result, active excited molecules, radicals, and ions are generated, a chemical reaction is promoted, and a thin film is formed on the surface of the wafer 1.

In the carry-out step, first, the lifting device 60 is used to lower the susceptor 40 to the lower limit position. As a result, the wafer 1 moves from the wafer mounting surface 41 to the head 52 of the lift pin 50. Next, the drive unit 22 of the gate valve 20 is driven to move the door unit 21 to open the wafer entry/takeout port 12 to the outside. Then, the wafer 1 moved to the head 52 of the lift pin 50 is carried out to the outside by using a wafer transfer robot (not shown).

In the plasma CVD apparatus 100 according to the present embodiment having the above configuration, a ventilation path 55 is formed between the lift pin through hole 44 of the susceptor 40 and the lift pin 50 in the wafer support apparatus 30 arranged inside the chamber 10. Therefore, when the inside of the chamber 10 of the plasma CVD apparatus 100 is depressurized, gas between the wafer 1 and the wafer mounting surface 41 can be discharged to the outside through the ventilation passage 55. For this, the gas remaining between the wafer 1 and the wafer mounting surface 41 makes it difficult for the wafer 1 arranged on the wafer mounting surface 41 to move (slip). Therefore, by using the plasma CVD apparatus 100 according to the present embodiment, a thin film having a uniform film thickness can be stably formed on the surface of the wafer 1.

In the present embodiment, the lift pin 50, a shaft 51 and a head 52, and the lift pin through hole 44 has a head insertion portion 44*a*, and a shaft insertion portion 44*c* connected to a head insertion portion 44*a* via a step portion 44*b*. The head 52 of the lift pin 50 has a notch 53 formed in a part of the surface of the lift pin through hole 44 on the step portion 44*b* side. Therefore, when the susceptor 40 is moved to the upper limit position by the elevating device 60, a gap is created between the head 52 and the step portion 44*b*, so that a ventilation path 55 is surely formed between the lift pin through hole 44 and the lift pin 50. For this, by reducing the pressure inside the chamber 10, a gas between the wafer 1 and the wafer mounting surface 41 can be reliably discharged to the outside. Further, when the susceptor 40 is moved to the lower limit position, the head 52 of the lift pin 50 and the step portion 44*b* of the through hole 44 for the lift pin are separated from each other, so that the wafer 1 can be separated from the wafer mounting surface 41.

Although the embodiments of the present disclosure have been described so far with reference to the drawings, the present disclosure is not limited to the above-described embodiments and can be appropriately modified without departing from the technical idea of the present disclosure.

In the present embodiment, the ventilation passage 55 is formed between the lift pin 50 and the lift pin through hole 44 by the notch 53 formed in the head 52 of the lift pin 50, but the present embodiment is limited to this. For example, instead of the ventilation passage 55, a ventilation hole penetrating the susceptor 40 may be provided in the wafer mounting surface 41. Further, a notch may be formed in a part of the step portion 44*b* of the lift pin through hole 44.

Figure 6:
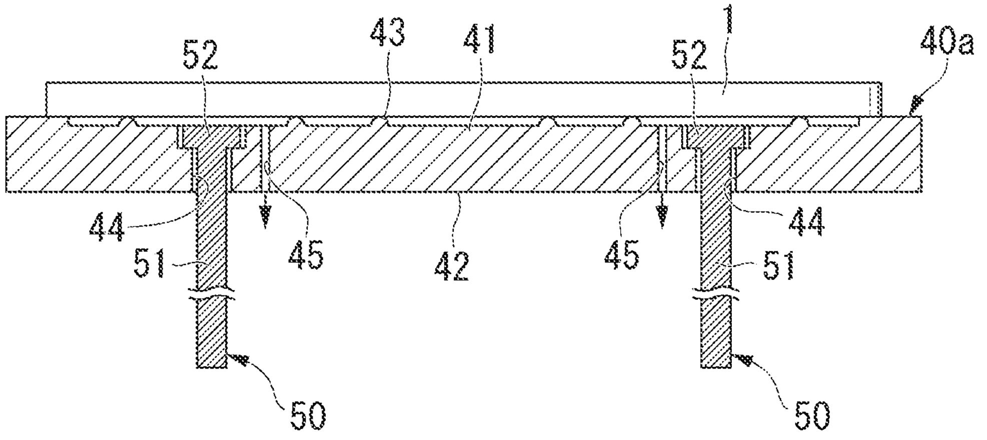
FIG. 6 is a cross-sectional view showing a first modification of the configuration of the susceptor according to the embodiment of the present disclosure.

FIG. 6 is a cross-sectional view showing a first modification of the configuration of the susceptor according to the embodiment of the present disclosure. In the susceptor 40*a* shown in FIG. 6, a ventilation hole 45 penetrating the susceptor 40*a* from the wafer mounting surface 41 toward the back surface 42 is formed in the wafer mounting surface 41. In the susceptor 40*a*, the head 52 of the lift pin 50 is not provided with a notch, and no ventilation path is formed between the lift pin 50 and the lift pin through hole 44. Since the other configurations are the same as those of the above-mentioned susceptor 40, the same reference numerals are given and the description thereof will be omitted.

Since the susceptor 40*a* is formed with the ventilation holes 45, a gas between the wafer 1 and the wafer mounting surface 41 can be reliably discharged to the outside by reducing the pressure inside the chamber 10. In the susceptor 40*a*, a ventilation path is not formed between the lift pin 50 and the lift pin through hole 44, but a ventilation path may be formed between the lift pin 50 and the lift pin through hole 44.

Figure 7:
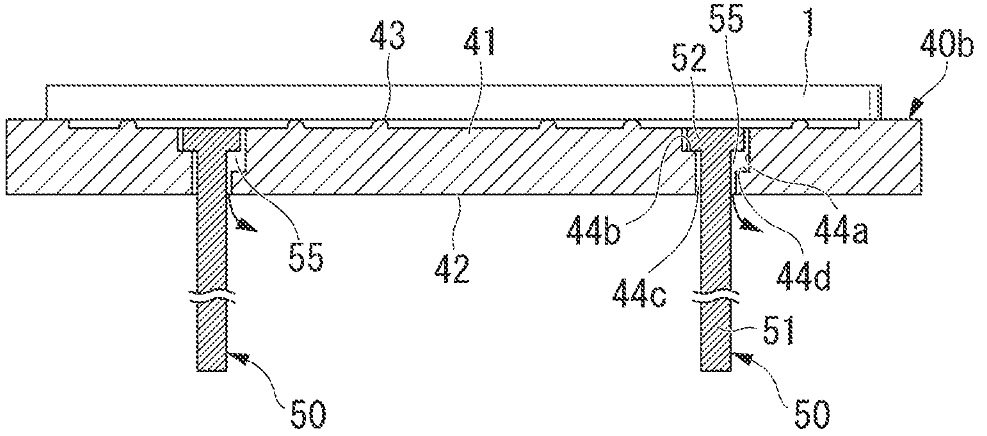
FIG. 7 is a cross-sectional view showing a second modification of the configuration of the susceptor according to the embodiment of the present disclosure.

FIG. 7 is a cross-sectional view showing a second modification of the configuration of the susceptor according to the embodiment of the present disclosure. In the susceptor 40*b* shown in FIG. 7, a notch 44*d* is formed in a part of the step portion 44*b* of the through hole 44 for the lift pin. Since the other configurations are the same as those of the above-mentioned susceptor 40, the same reference numerals are given and the description thereof will be omitted.

When the susceptor 40*b* is moved to the upper limit position, a gap is formed between the head 52 and the step portion 44*b*, so that the ventilation path 55 is surely formed between the lift pin through hole 44 and the lift pin 50. Therefore, by reducing the pressure inside the chamber 10, the gas between the wafer 1 and the wafer mounting surface 41 can be reliably discharged to the outside.

Further, in the present embodiment, the lift pin 50 has a shaft 51 and a head 52 having a diameter larger than that of the shaft 51, but the shape of the lift pin 50 is not limited to this. For example, the lift pin may be a columnar body having a constant diameter.

Figure 8:
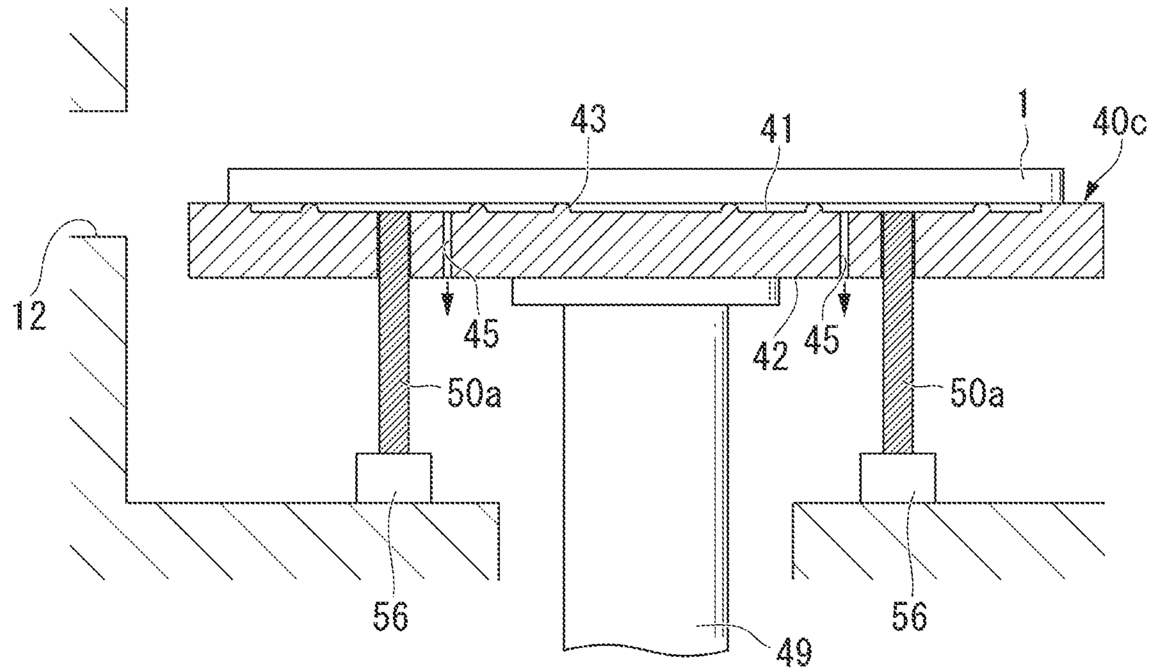
FIG. 8 is a cross-sectional view showing a third modification of the configuration of the susceptor according to the embodiment of the present disclosure.

FIG. 8 is a cross-sectional view showing a third modification of the configuration of the susceptor according to the embodiment of the present disclosure. In the susceptor 40*c* shown in FIG. 8, the lift pin 50*a* is a columnar body having a constant diameter. The lift pin 50*a* is supported by the lift pin support portion 56. The lift pin support portion 56 is fixed to the bottom surface 11*a* of the chamber main body 11. Further, in the wafer mounting surface 41, a ventilation hole 45 penetrating the susceptor 40*a* from the wafer mounting surface 41 toward the back surface 42 is formed. In the susceptor 40*c*, there is no gap between the lift pin 50*a* and the lift pin through hole 44, and no ventilation path is formed. Since the other configurations are the same as those of the above-mentioned susceptor 40, the same reference numerals are given and the description thereof will be omitted.

Since the susceptor 40*c* is formed with ventilation holes 45, a gas between the wafer 1 and the wafer mounting surface 41 can be reliably discharged to the outside by reducing the pressure inside the chamber 10. In the susceptor 40*c*, there is no gap between the lift pin 50*a* and the lift pin through hole 44, and no ventilation path is formed. However, a gap may be provided between the lift pin 50*a* and the lift pin through hole 44, and a ventilation path may be formed.

Figure 9:
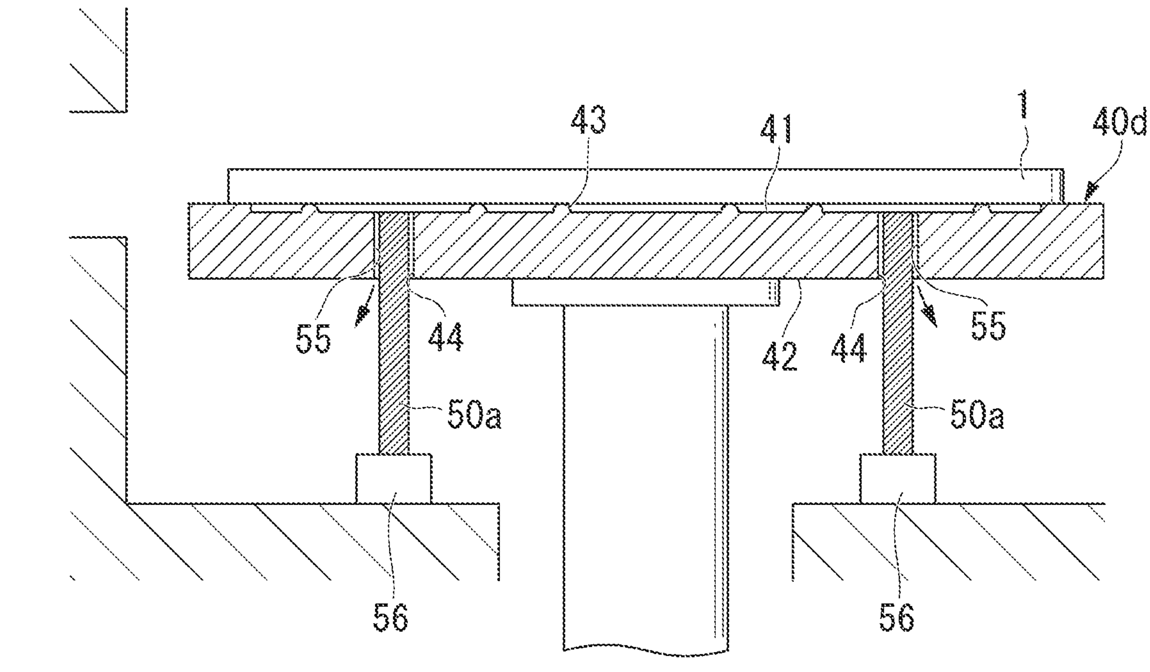
FIG. 9 is a cross-sectional view showing a fourth modification of the configuration of the susceptor according to the embodiment of the present disclosure.

FIG. 9 is a cross-sectional view showing a fourth modification of the configuration of the susceptor according to the embodiment of the present disclosure. In the susceptor 40*d* shown in FIG. 9, the lift pin 50*a* is a columnar body having a constant diameter. The lift pin 50*a* is supported by the lift pin support portion 56. A gap is provided between the lift pin 50*a* and the lift pin through hole 44, and a ventilation passage 55 is formed by this gap. Since the other configurations are the same as those of the above-mentioned susceptor 40, the same reference numerals are given and the description thereof will be omitted.

Since the susceptor 40*d* has a ventilation path 55 formed between the lift pin 50*a* and the lift pin through hole 44, by depressurizing the inside of the chamber 10, a gas between the wafer 1 and the wafer mounting surface 41 can be reliably discharged to the outside.

Further, in the present embodiment, the number of wafer support devices 30 arranged inside the chamber 10 is one, but the number of wafer support devices 30 is not limited to this. For example, the number of wafer support devices arranged inside the chamber 10 may be two or more.

Figure 10:
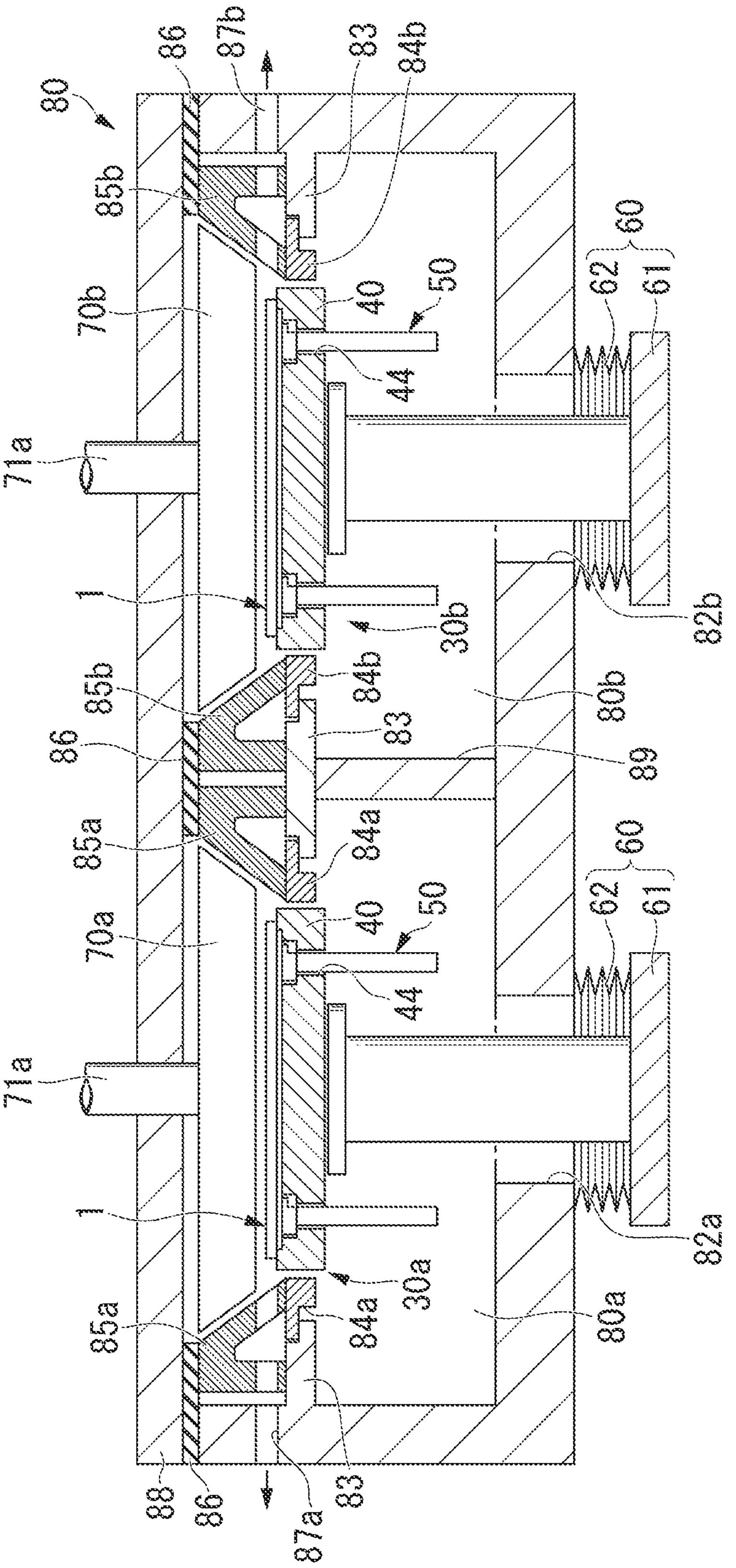
FIG. 10 is a cross-sectional view showing another example of the chamber of the plasma CVD apparatus according to the embodiment of the present disclosure.

FIG. 10 is a cross-sectional view showing another example of the chamber of the plasma CVD apparatus according to the embodiment of the present disclosure.

In the plasma CVD device 100*a* of the present embodiment shown in FIG. 10, two wafer support devices are arranged inside the chamber 80. The inside of the chamber 80 is divided into a first region 80*a* in which the first wafer support device 30*a* is arranged and a second region 80*b* in which the second wafer support device 30*b* is arranged. Since the configurations of the first wafer support device 30*a* and the second wafer support device 30*b* are the same as those of the above-mentioned wafer support device 30, the same reference numerals are given and the description thereof will be omitted.

The chamber 80 has a chamber body 81 and a lid material 88. The chamber body 81 and the lid material 88 may be made of a metal material. As the metal material, for example, aluminum can be used.

The inside of the chamber 80 is divided into a first region 80*a* and a second region 80*b* by a partition wall 89 arranged in the center. Through holes 82*a* and 82*b* for raising and lowering the susceptor are provided at the bottoms of the first region 80*a* and the second region 80*b*, respectively.

A protrusion 83 is provided on the side portion of the chamber body 81 and the partition wall 89. The protrusion 83 forms two openings, which are two circular openings in a plan view, above the first region 80*a* and the second region 80*b*, respectively. An annular insulating member 84*a* for the first region is arranged at the tip of the protrusion 83 forming the opening of the first region 80*a*, and an annular insulating member 84*b* for second region 80*b* is arranged at the tip of the protrusion 83 forming the opening of the second region 80*b*.

As the material of the annular insulating member 84*a* for the first region and the annular insulating member 84*b* for the second region, a ceramic material such as $Al_2O_3$ can be used. A wafer entry/takeout port is provided on the side of the chamber body 81 below the protrusion 83 (not shown).

The shower head support member 85*a* for the first region is arranged on the protrusion 83 and the annular insulating member 84*a* for the first region, and a shower head support member 85*b* for the second region the first region is arranged on the protrusion 83 and the annular insulating member 84*b* for the second region. The shower head support member 85*a* for the first region and the shower head support member 85*b* for the second region are ring-shaped members having an inverted conical opening having a smaller diameter from the upper side to the lower side. As the material of the shower head support member 85*a* for the first region and the shower head support member 85*b* for the second region, for example, a ceramic material such as $Al_2O_3$ can be used.

An insulating member 86 is arranged above the shower head support member 85*a* for the first region and the shower head support member 85*b* for the second region. As the material of the insulating member 86, for example, a ceramic material such as $Al_2O_3$ can be used.

On the side of the chamber body 81, a first region exhaust gas port 87*a* penetrating the first region shower head support member 85*a* and a second region exhaust gas port 87*b* penetrating the second region shower head support member 85*b* are provided.

The shower head 70*a* for the first region is supported by the first region shower head support member 85*a*. The shower head 70*a* for the first region is connected to the first source gas pipe 71*a*. The shower head 70*b* for the second region is supported by the second region shower head support member 85*b*. The shower head 70*b* for the second region is connected to the second source gas pipe 71*b*.

In the plasma CVD device 100*a* according to the present embodiment having the above configuration, two wafer support devices, a first wafer support device 30*a* and a second wafer support device 30*b*, are arranged inside the chamber 80. Therefore, the efficiency of film formation is improved. Further, in the first wafer support device 30*a* and the second wafer support device 30*b*, a ventilation path 55 is formed between the lift pin through hole 44 and the lift pin 50 of the susceptor 40, respectively. Therefore, by using the plasma CVD device 100*a* according to the present embodiment, a thin film having a uniform film thickness can be stably formed on the surface of the wafer 1.

The film forming processing apparatus according to the present disclosure has been described by taking a plasma CVD apparatus as an example, but the film forming apparatus is not limited to the plasma CVD apparatus. The film forming apparatus may be, for example, a thermal CVD apparatus, a plasma ALD apparatus, or a thermal ALD apparatus.

What is claimed is:

1. A wafer support device comprising:

a susceptor having a wafer mounting surface provided on one surface and a lift pin through hole arranged in the wafer mounting surface;

a lift pin inserted into the lift pin through hole; and an elevating device that raises and lowers the susceptor, wherein the wafer mounting surface of the susceptor is uneven, wherein the lift pin has a shaft and a head having a diameter larger than that of the shaft, wherein the lift pin through hole comprises a head insertion portion having a diameter larger than that of the head of the lift pin formed on the wafer mounting surface side, a shaft insertion portion connected to the head insertion portion via a step portion and having a smaller diameter than the head insertion portion and a larger diameter than the shaft of the lift pin, wherein the step portion comprises a notch, and wherein a ventilation path is defined between the head insertion portion, the shaft insertion portion, the step portion, and the notch of the lift pin through hole and the lift pin.

2. The wafer support device according to claim 1, wherein when the susceptor is moved to a lower limit position by the elevating device, the head and the step portion are separated, and when the susceptor is moved to an upper limit position by the elevating device, the head and the step portion are engaged so as to form a gap defined at least in a part thereof.

3. The wafer support device according to claim 2, wherein the wafer mounting surface has a plurality of protrusions.

4. The wafer support device according to claim 1, wherein the notch is below the step portion.

5. A film forming apparatus comprising; a chamber and a wafer support device according to claim 1, which is located inside the chamber.

6. The wafer support device according to claim 1, wherein the ventilation path is asymmetrical.

7. The wafer support device according to claim 1, wherein the lift pin is made of metallic material.

8. The wafer support device according to claim 1, wherein the susceptor is formed of thermally conductive material.

9. The wafer support device according to claim 1, further comprising a heating element disposed within the susceptor.

10. A wafer support device comprising:

a susceptor having a wafer mounting surface provided on one surface and a lift pin through hole arranged in the wafer mounting surface;

a lift pin inserted into the lift pin through hole;

wherein the lift pin has a shaft and a head having a diameter larger than that of the shaft, wherein the lift pin through hole comprises a head insertion portion having a diameter larger than that of the head of the lift pin formed on the wafer mounting surface side, a shaft insertion portion connected to the head insertion portion via a step portion and having a smaller diameter than the head insertion portion and a larger diameter than the shaft of the lift pin, wherein the step portion comprises a notch, and wherein a ventilation path is defined between the head insertion portion, the shaft insertion portion, the step portion, and the notch of the lift pin through hole and the lift pin, an elevating device that raises and lowers the susceptor; and.

11. A film forming apparatus comprising; a chamber and a wafer support device according to claim 10, which is located inside the chamber.

* * * * *